(12) United States Patent
Gibbs et al.

(10) Patent No.: US 8,976,527 B2
(45) Date of Patent: Mar. 10, 2015

(54) FORCE AND HEAT SPREADING PCB FOR LCD PROTECTION AND INTERCONNECTION

(71) Applicant: Apple Inc., Cupertino, CA (US)

(72) Inventors: Kevin D. Gibbs, Menlo Park, CA (US); Amy Qian, Cupertino, CA (US); John Raff, Menlo Park, CA (US); Derek Wright, San Francisco, CA (US)

( * ) Notice: Subject to any disclaimer, the term of this patent is extended or adjusted under 35 U.S.C. 154(b) by 179 days.

(21) Appl. No.: 13/631,973

(22) Filed: Sep. 29, 2012

(65) Prior Publication Data

US 2014/0092560 A1 Apr. 3, 2014

(51) Int. Cl.
*H05K 7/20* (2006.01)
*H05K 3/30* (2006.01)

(52) U.S. Cl.
USPC ............... 361/705; 361/679.02; 361/679.21; 361/679.54; 361/761; 349/58; 349/150; 349/190

(58) Field of Classification Search
USPC ............. 361/679.01, 679.02, 679.22, 679.46, 361/679.54, 704–714, 719–722 M, 748, 361/749; 165/80.2, 80.3, 104.33, 185; 313/46, 582; 349/58, 60–65, 69, 70, 349/150, 161, 149, 151, 152; 345/60, 905; 362/345, 373, 294, 561, 218
See application file for complete search history.

(56) References Cited

U.S. PATENT DOCUMENTS

| | | | |
|---|---|---|---|
| 6,839,100 B1 * | 1/2005 | Saito et al. | 349/58 |
| 7,086,761 B2 * | 8/2006 | Won et al. | 362/373 |
| 7,542,286 B2 * | 6/2009 | Kang | 361/690 |
| 7,728,948 B2 * | 6/2010 | Nishi et al. | 349/190 |
| 7,990,512 B2 * | 8/2011 | Yang | 349/150 |
| 8,400,607 B2 * | 3/2013 | Cappaert et al. | 349/161 |
| 8,770,805 B2 * | 7/2014 | Chang et al. | 362/373 |
| 2007/0189042 A1 * | 8/2007 | Pai et al. | 362/632 |
| 2008/0106911 A1 * | 5/2008 | Park et al. | 362/612 |
| 2012/0182700 A1 * | 7/2012 | Byeon et al. | 361/749 |

* cited by examiner

*Primary Examiner* — Michail V Datskovskiy
(74) *Attorney, Agent, or Firm* — Womble Carlyle Sandridge & Rice, LLP

(57) ABSTRACT

The described embodiment relates generally to the manufacture of display assemblies. More particularly the use of alternative back plates for a display assembly is discussed. By using a printed circuit board (PCB) in lieu of a metal backer heat can be evenly spread across the backer by applying a layer of copper configured to normalize a spread of heat across the printed circuit board. The configuration of the copper layer can be configured based on a tested or simulated heat map that accounts for proximate heat producing elements. The PCB can also advantageously act as an interconnection layer between other electrical components disposed within the electronic device.

20 Claims, 7 Drawing Sheets

FORCE AND HEAT SPREADING PCB FOR LCD PROTECTION AND INTERCONNECTION

BACKGROUND

1. Technical Field

The described embodiment relates generally to the manufacture of display assemblies. More particularly the use of alternative back plates for a display assembly is discussed.

2. Related Art

Conventional display assemblies include back plates to protect fragile circuitry within the display assembly. Back plates are often constructed from steel alloys which tend to perform relatively poorly at distributing heat. As a result when heat emanating from heat emitting members is distributed unevenly across the display assembly hot spots can develop. In some cases these hot spots can cause damage to the display assembly due to overheating. Such hot spots can also reduce the overall operating performance of an associated electronic device when compared with an electronic device having a display assembly with a more evenly spread heat profile. Aluminum backing plates can allow for more even heat distribution of the heat since the thermal conductivity of aluminum is significantly higher than steel alloys. However, uneven heating can still develop and cause destructive heating of heat sensitive portions of the LCD due to uneven heating of the display assembly.

Thus what is desired is a display assembly back plate configured to spread heat evenly across a display assembly.

SUMMARY

This paper describes many embodiments that relate to a system, method and apparatus for enabling precise material removal as part of a finishing process.

In a first embodiment an electronic device is disclosed. The electronic device includes at least the following: (1) a device housing; (2) a display panel; (3) an integrated support member substantially parallel to both a first inner surface of the device housing and the display panel, and (4) a number of mounting attachments configured to mechanically couple the integrated support panel to the device housing. The integrated support member includes at least the following: a glass reinforced epoxy laminate substrate; a plurality of electrical components surface mounted to a first surface of the glass reinforced epoxy laminate substrate; a first layer of copper configured to dissipate heat across the first surface of the glass reinforced epoxy laminate substrate; and a second layer of copper configured to transmit electrical signals across the first surface of the glass reinforced epoxy laminate substrate. The first and second layer of copper are coplanar.

In another embodiment a laminated support member is disclosed. The laminated support member is configured to support a display panel. The laminated support member includes at least the following: at least one heat transfer layer, configured to normalize a distribution of heat across the laminated support layer; and at least one signal transfer layer. The at least one signal transfer layer and the at least one heat transfer layer are coplanar.

In yet another embodiment a method for manufacturing a display assembly is disclosed. The method includes at least the following steps: (1) forming a first pattern of copper on a printed circuit board (PCB) substrate; (2) surface mounting a plurality of LEDs to the PCB substrate; (3) mechanically coupling the PCB substrate to an inner surface of a device housing; (4) mechanically coupling the display assembly to the PCB substrate; and (5) electrically grounding the PCB substrate to the device housing. The first pattern of copper is formed in accordance with a preceding heat mapping of a representative display assembly.

BRIEF DESCRIPTION OF THE DRAWINGS

The embodiments will be readily understood by the following detailed description in conjunction with the accompanying drawings, wherein like reference numerals designate like structural elements, and in which.

DETAILED DESCRIPTION OF SELECTED EMBODIMENTS

Figure 1:
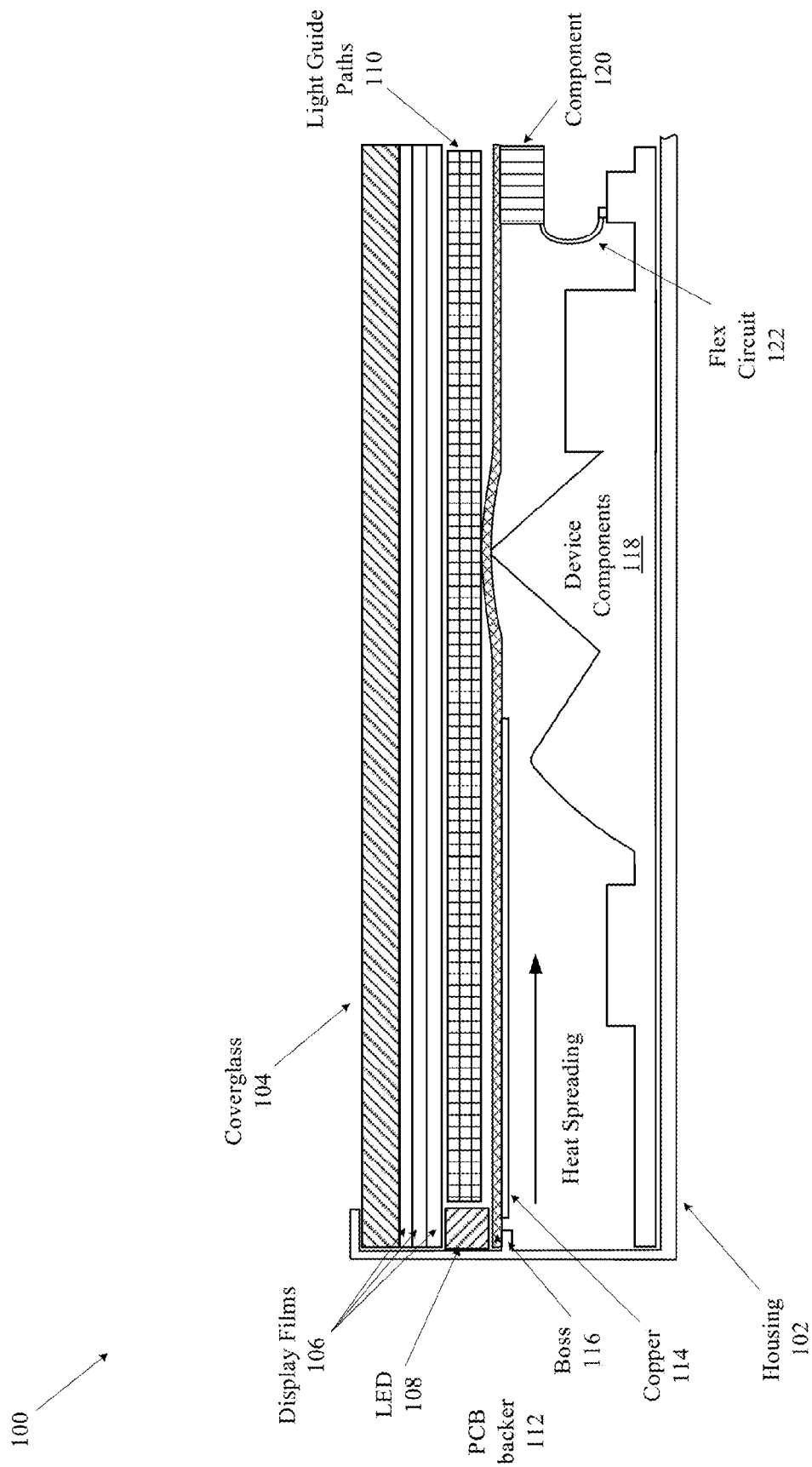
FIG. 1 shows a partial cross-sectional side view of an electronic device.

The described embodiments relate generally to the described embodiment relates generally to the manufacture of display assemblies. More particularly the use of alternative back plates for a display assembly is discussed.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Manufacturing processes for producing consumer electronic devices often involve display technology. Electronic displays are often deployed as a display assembly with an integrated metal back plate for protecting fragile components within the display assembly such as light guide pathways and display films. Unfortunately, metal back plates can do a poor job of conducting heat, resulting in the development of hot spots across a back portion of a display assembly. These hot spots can result in an overall reduction in device performance since thermal levels of the hot spots are regulated to prevent damage to individual components within the device. By evenly spreading heat across a back plate a larger amount of heat can be generated without doing damage to components within the electronic device.

In one embodiment a printed circuit board (PCB) backer can be used in lieu of a metal back plate for a display assembly. Such a configuration provides a number of advantages, allowing the PCB backer to be used for structural support, thermal protection, and electrical routing. In this embodiment the display assembly can have a number of light emitting diodes (LEDs) which light the display assembly. The PCB backer can be made of a material such as FR4 which is a glass reinforced epoxy laminate. The concentration of LEDs on one side of the display assembly can cause significant heat buildup on one side of the display assembly. A heat map can be produced by taking heat measurements across the display assembly to determine amounts of heat being generated by components within the display assembly, and in some embodiments by components arranged proximate to the display assembly when the display assembly is inside the electronic device. The PCB can include a number of copper traces arranged into fingers. In one embodiment as the fingers stretch farther away from the LEDs the copper fingers get thinner as the heat dissipates. The copper fingers can be arranged on either a lower surface of the PCB an upper surface of the PCB or even both surfaces in some embodiments. Since copper has much better thermal conductivity than both steel and aluminum, thermal energy can be distributed much more efficiently. Furthermore, since the copper traces can be etched in any location along the PCB substrate, the fingers can be optimized to spread heat evenly for a given heat loading condition. In some embodiments, in addition to the copper fingers ellipses or other geometric shapes can be arranged along the surface of the PCB to dissipate heat from other heat emitting devices such as for example an integrated circuit located below the display assembly.

In addition to evenly spreading heat across the electronic device the PCB substrate and copper are rigid enough to prevent other electronic components from inadvertently piercing fragile components within the display assembly. Where a point load comes into contact with the PCB, the PCB can spread the point load along a wider area of the PCB and prevent damage to the display assembly. Another added advantage of this embodiment is that the LED array can be surface mounted to the PCB substrate, as opposed to mounting it on a separate flex circuit. In addition to spreading heat evenly the PCB substrate can also have electrical traces for electrical components attached to the PCB substrate such as for example the LEDs. By drilling vias through the PCB components can be in communication between upper and lower surfaces of the PCB. Furthermore, where a logic board or another circuit board is arranged underneath the PCB a flex circuit can be used to route signals from the PCB substrate to the other circuit board. Since this connection can be made substantially anywhere across the surface of the PCB backer the flex connector can be short extending down to another connector to couple electrical signals between the electrical traces disposed on the PCB substrate and the other circuit board.

These and other embodiments are discussed below with reference to FIGS. 1-7; however, those skilled in the art will readily appreciate that the detailed description given herein with respect to these figures is for explanatory purposes only and should not be construed as limiting.

FIG. 1 shows a partial cross-sectional side view of an electronic device 100. Electronic device 100 includes housing 102. Housing 102 can be made from any suitable rigid material to support components within electronic device. In one embodiment housing 102 can be made of aluminum. Within housing 102 is a display assembly. The display assembly includes a number of sub-components. Coverglass 104 provides protection for display assembly components and an aesthetically pleasing surface through which a user can control the device. In one embodiment device control can be had through a touch sensor embedded (not shown) arranged underneath the coverglass allowing user manipulation of software running on electronic device 100. Beneath coverglass 104 are fragile display films 106 configured to display at least a user interface. Display films 106 can include for example polarizing films and color filter layers. LED 108 is one of a number of LEDs arranged on one side of the display assembly. LED 108 is configured to emit light along light guide paths (LGPs) 110. LGPs 110 direct light along a lower surface of the display assembly in such a way so that LEDs 108 arranged on one side of the display assembly can evenly illuminate the display. In this embodiment LED 108 can be surface mounted to PCB backer 112, alternatively a separate flex can be used to electrically couple LED 108 to PCB backer 112. By directly mounting LED 108 to PCB backer 112 vertical space savings can be accomplished.

Copper 114 can be disposed on a lower surface of PCB backer 112 as shown or can be on an upper surface of PCB backer 112. Copper 114 can be configured in a series of fingers extending away from heat emitting LED 108. In this way heat can be efficiently dispersed across PCB backer 112 by copper 114. Boss 116 can be configured on an inner surface of housing 102. Boss 116 can support PCB backer 112 which can in turn provide support for the entire display assembly. In this configuration PCB backer 112 can act as a midplate for electronic device 100. Alternatively the display assembly can be supported by a bracket soldered onto an inner surface of housing 102. In some cases PCB backer 112 can act as structural support for electronic device 100. Other device components 118 can be arranged on a lower inner surface of housing 102. In some cases a portion of one of device components 118 can come into contact with a lower surface of PCB backer 112. In such a case PCB backer 112 can plastically deform around the point load, thereby spreading stress from the point load across the lower surface and preventing the contact from damaging the display assembly as illustrated. Device components 118 can be put in electrical contact with electrical components arranged on PCB backer 112. In one embodiment component 120 can be surface mounted to a lower surface of PCB backer 112. Component 120 can then be put into electrical contact with device components 118 by flex circuit 122. Component 120 can also be in electrical contact with PCB backer 112 through surface mounting contacts on PCB backer 112. In another embodiment a flex circuit can extend directly from a connector located on PCB backer 112 to a one of device components 118 to enable electrical signals to pass between PCB backer 112 and device components 118, which can be arranged on another circuit board such as for example a main logic board.

Figure 2A:
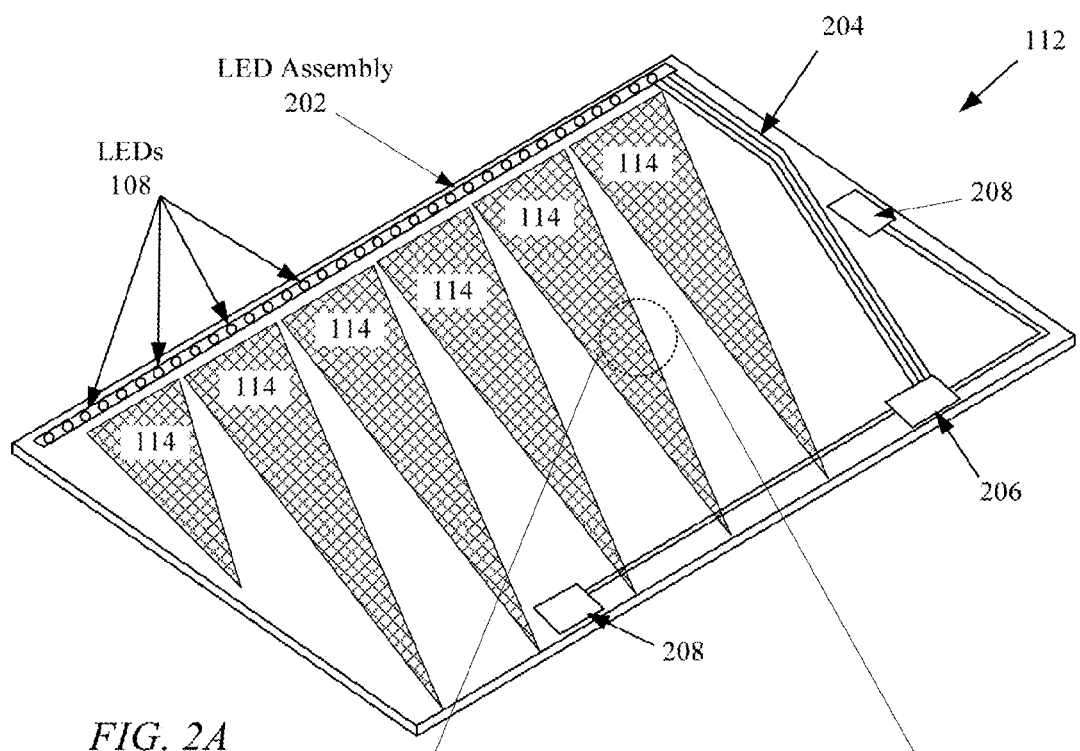
FIG. 2A shows a perspective view of a PCB backer with copper fingers for normalizing heat across the PCB backer.

FIG. 2A illustrates a perspective view of PCB backer 112 with a number of copper fingers 114 configured to normalize heat across PCB backer 112. Copper fingers are illustrated with an overall triangular pattern made up of an internal grid of copper. Copper fingers can narrow as they reach a side opposite LED Assembly 202 when LEDs 108 are a primary source of heat in the display assembly. Copper fingers 114 are configured to narrow as heat is dissipated across PCB backer 112 resulting in an amount of heat commensurate with an amount of area associated with the side opposite LEDs 108 to be thermally conducted to that side of PCB backer 112. As discussed earlier electrical traces 204 can also be disposed on PCB backer 112 allowing communications to be routed across PCB backer 112, in this embodiment from LED array 202 to LED array connector 206. Signals from a main logic board located below PCB backer 112 can in this way be routed through LED array connector 206 instead of below LED assembly 202 where there may or may not be room in the electronic device for such components. In this way cable routing and component placement can be substantially simplified. In some embodiments LED array connector 206 can also be connected to components 208 also mounted to PCB backer 112. Components 208 can in some embodiments be display designed to assist in processing graphics displayed on the display assembly. In one embodiment component 208 can be configured to modulate intensity of LED assembly 202.

Figure 2B:
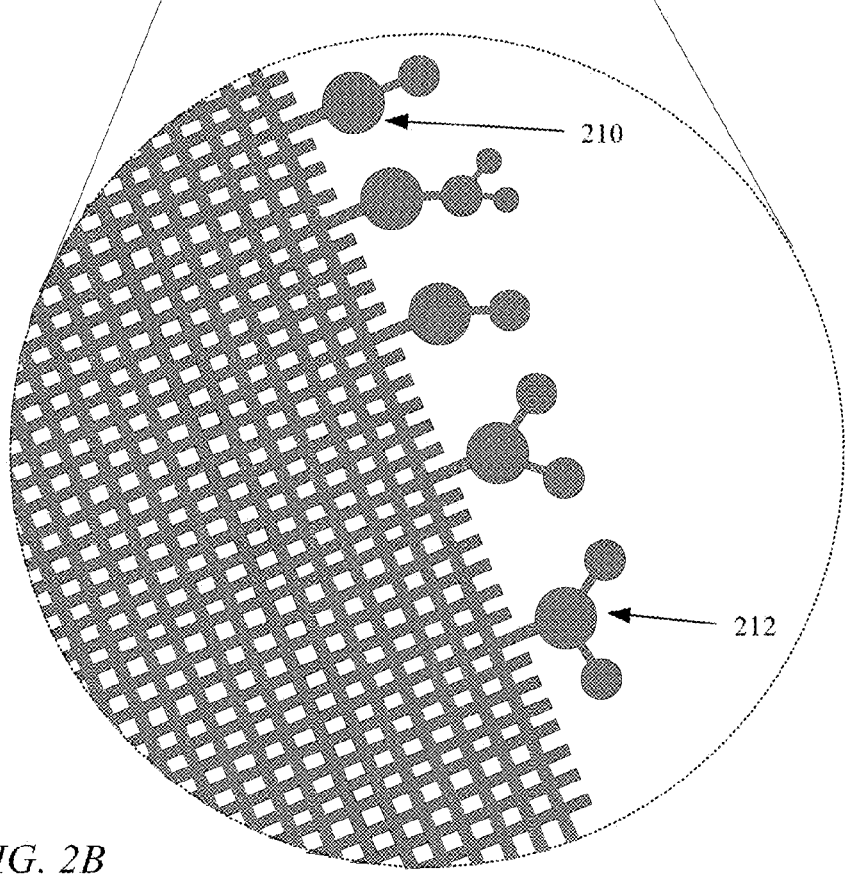
FIG. 2B shows a close up view of an edge portion of a copper finger.

FIG. 2B shows a close up view of an edge portion of one of copper fingers 114. A substantial portion of copper finger 114 can be configured in a grid pattern as illustrated. In some embodiments other patterns can be desirable, while in other embodiments copper fingers 114 can be a solid layer. In this illustrated embodiment edge portions of copper fingers 114 can have dissipation pathways to gradually spread heat from copper fingers 114. In this embodiment a series of heat dissipation discs 210 can be connected by copper traces such that density of the copper trails off slowly rather than immediately. In other embodiments this can be accomplished by increasing spacing between individual grid segments near edge portions of copper fingers 114. Dissipation discs 210 can also be useful for even dissipation of heat to portions of PCB backer 112 that do not have etched copper. In some embodiments a series of dissipation disks 210 can be connected to smaller dissipation discs 210 as heat travels farther from copper fingers 114. As copper finger extends farther from a main heat emitting source, dissipation disc 212 in particular can be spaced farther apart from neighboring dissipation discs due to smaller amounts of heat running across narrower portions of copper fingers 114.

Figure 3:
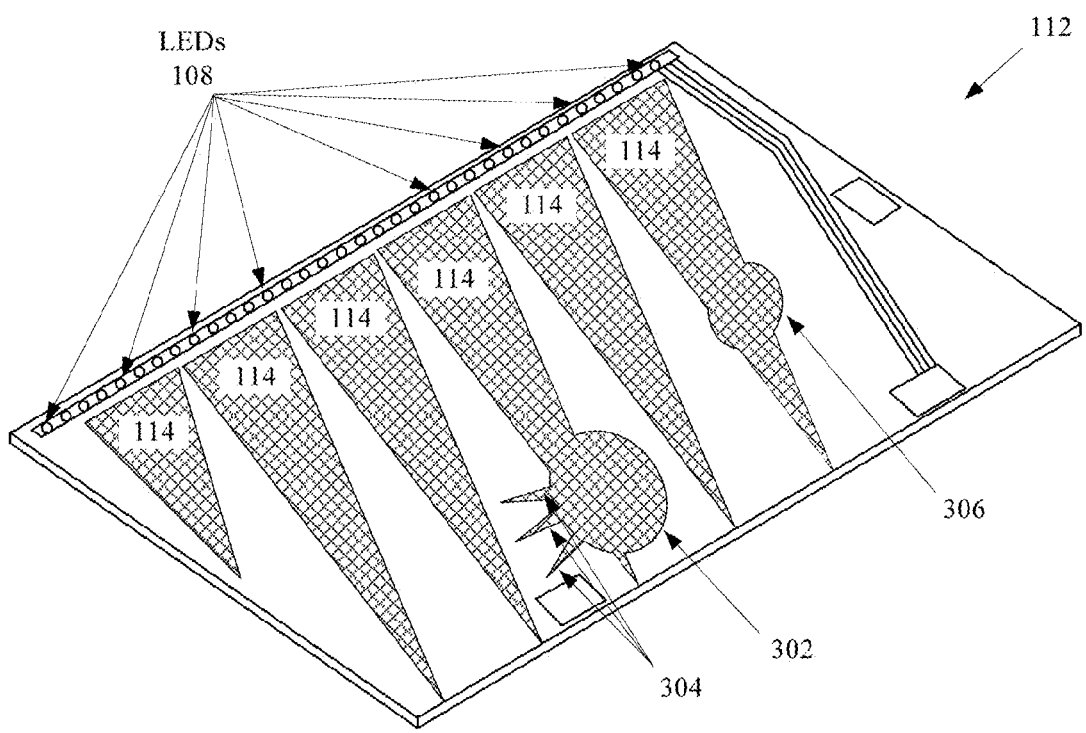
FIG. 3 shows an alternative embodiment of a PCB backer.

FIG. 3 shows an alternative embodiment of PCB backer 112. In this embodiment other heat emitting sources are compensated for by a different configuration of copper on PCB backer 112. In the illustrated embodiment PCB backer 112 can be subject to other heat sources than LEDs 108 such as for example a central processing unit (CPU). When the CPU is located below PCB backer 112 a significant amount of heat can be radiated from the CPU to PCB backer 112. In such a case copper disc 302 can be disposed on PCB backer 112 thereby helping to dissipate heat in that particular portion of PCB backer 112. Copper disc 302 can include copper fingers 304 to further help direct heat to a portion of PCB backer that may not be receiving an even amount of heat. In other embodiments copper disc 302 can have copper fingers 304 evenly spaced around its periphery. Also illustrated is copper disc 306. In some embodiments another heat emitting member can be located proximate to PCB backer 112, in some cases this can be a graphics processing unit (GPU) separate from the CPU. Copper disc 306 can be smaller than copper disc 302 when a smaller amount of heat requires dissipation in the area it is disposed on.

Figure 4:
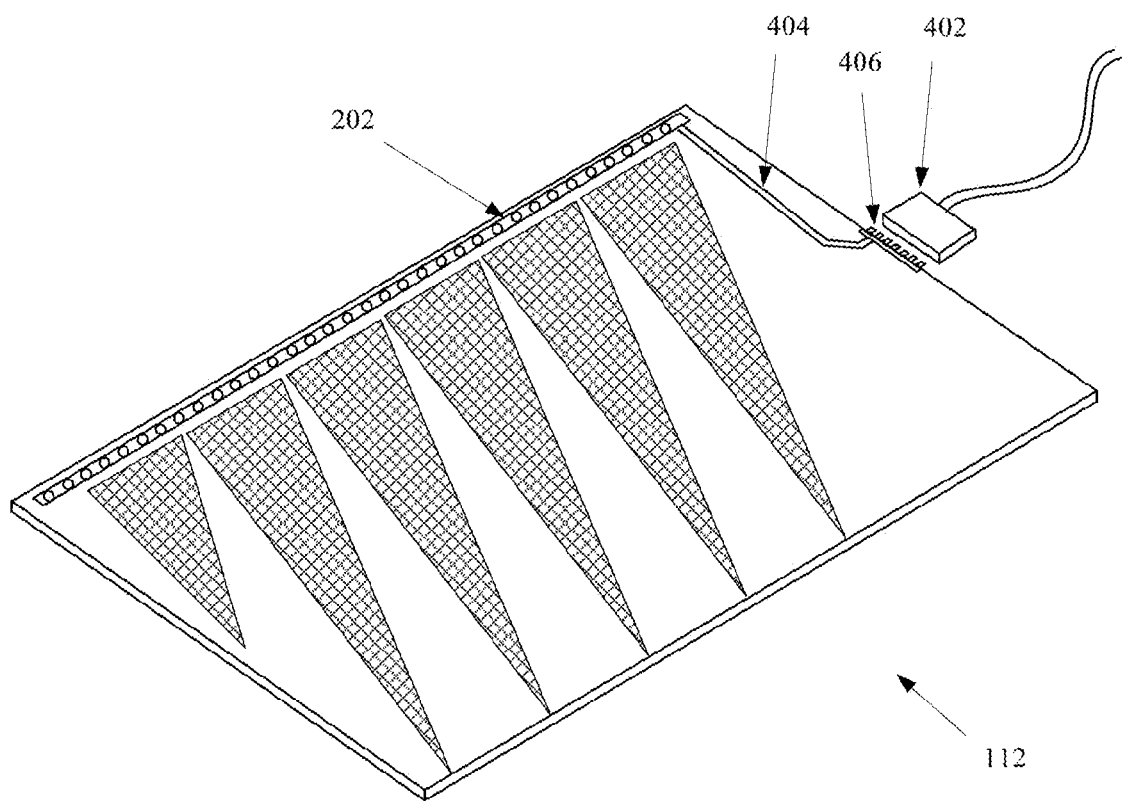
FIG. 4 shows an alternative embodiment in which components arranged on PCB backer 112 are grounded through an external connector.

FIG. 4 shows an alternative embodiment in which components arranged on PCB backer 112 are grounded through an external connector. An electronic device 100 inside which PCB backer 112 is arranged in can have a housing with an opening for a cable 402. Cable 402 can be configured to charge electronic device 100 or transfer data in and out of electronic device 100. In this embodiment PCB backer 112 can have electrical traces 404 connecting at least one component, in the illustrated case LED array 202 to grounding fingers 406. Grounding fingers 406 are configured to contact a metal portion of cable 402 enabling grounding of components disposed on PCB backer 112 to cable 402.

Figure 5:
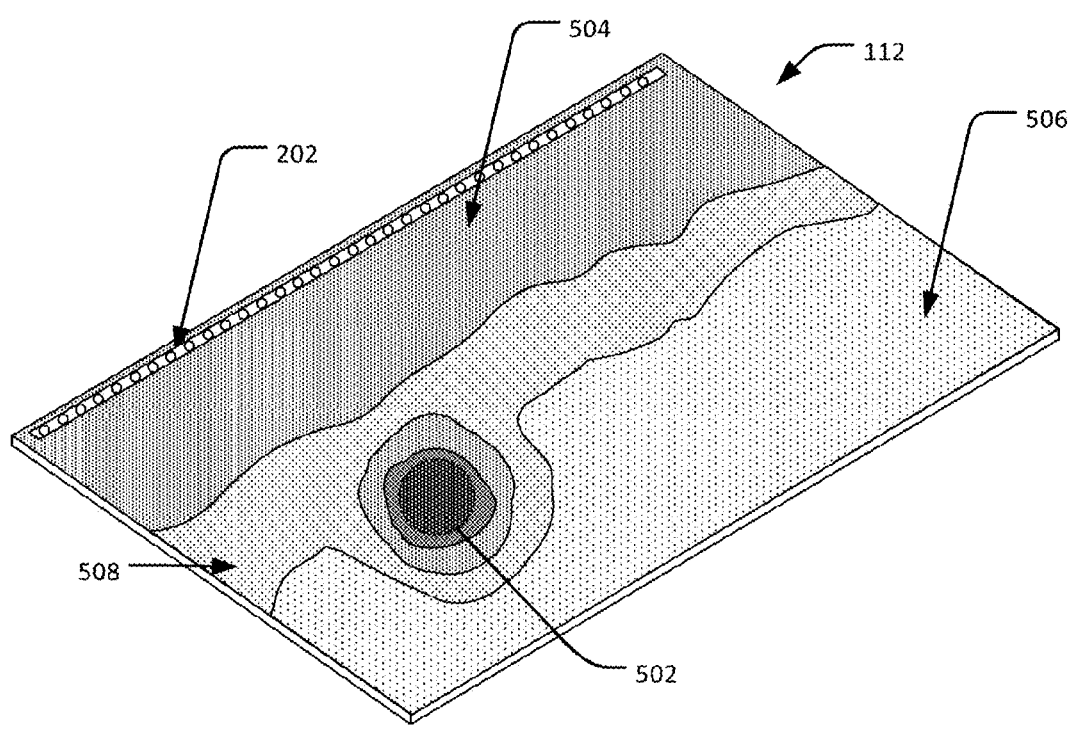
FIG. 5 shows a heat map for a PCB backer portion of a display assembly without copper fingers for even distribution of heat.

FIG. 5 shows a heat map 500 for a PCB backer 112 portion of a display assembly without copper fingers for evenly distributing heat. The illustrated embodiment shows heat emanating from a first heat source beneath portion 502 of PCB backer 112. Portion 502 has a comparatively high amount of heat with respect to remaining portions of PCB backer 112. Consequently, thermal parameters associated with such a device would need to keep portion 502 of PCB backer 112 within thermal parameters. Portion 504 has an elevated temperature as a result of heat emanating from LED assembly 202, while portion 506 has a comparably low temperature, being arranged farthest from heat emitting components associated with or proximate to the display assembly. Finally portion 508 of heat map 500 can be lower than portion 504 and hotter than portion 506. Heat map 500 can be used for designing electrical fingers across a production PCB backer, which can then be used to normalize a heat profile across PCB backer 112, thereby maximizing an amount of heat that can be absorbed by PCB backer 112. It should be noted that other methods of heat loading analysis are possible. For example measuring temperatures at different points of a surface of existing systems can provide a general temperature loading data. Alternatively, computer simulations can be used to help design the copper patterns described above.

Figure 6:
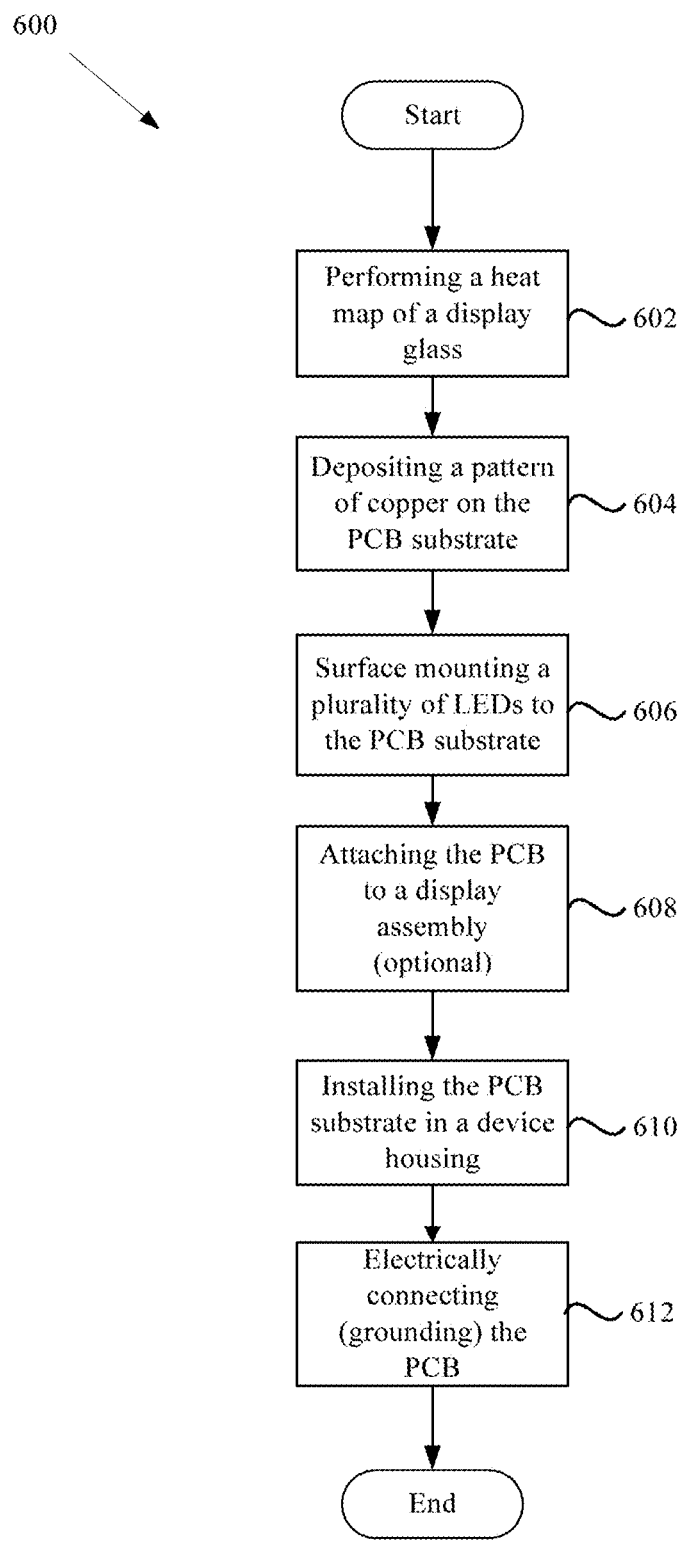
FIG. 6 shows a block diagram representing a method for manufacture and assembly of an electronic device.

FIG. 6 shows a block diagram representing a method 600 for manufacture and assembly of an electronic device. In a first step 602 a heat mapping analysis is done of an electronic device inside of which a display assembly is installed. In step 604 based on the heat mapping analysis a pattern of copper is formed on a PCB substrate. The copper pattern can be configured to have greater surface area towards portions of the PCB substrate that the heat mapping analysis shows have higher heat distribution. In addition to depositing copper for heat distribution purposes, copper can also be in the form of electrical traces for electrically coupling electrical components mounted to the PCB substrate. At step 606 a plurality of LEDs are surface mounted to at least one side of the PCB substrate. The surface mounted LEDs can be in electrical contact with one another based on electrical traces arranged on the PCB substrate. At step 608 the PCB substrate can be mechanically coupled to the display assembly. In another embodiment the PCB substrate can be inserted directly into a device housing of the electronic device and coupled to mounting points disposed across an inner surface portion of the device housing. In such a case at least a series of LEDs can be pre-attached to the PCB substrate prior to installation of the PCB substrate in the device housing. At step 610 the PCB substrate is installed into the enclosure with the attached display assembly. In the alternate embodiment the display assembly is mechanically coupled to the PCB substrate. In both cases the PCB substrate can substantially support the display assembly and provide it with mechanical and thermal protection from other components within the device housing. Finally, in step 612 the PCB substrate can be electrically connected to other electrical components within the device housing and/or electrically grounded to at least the device housing through at least the PCB substrate attachment points. Electrical traces disposed on the PCB substrate can couple any additional electrical components arranged on the PCB substrate. In some embodiments PCB substrate and its attached components can be externally grounded by a cable attached to an opening in the device housing. It should be noted that in some embodiments process 600 can be performed by a computer numerical control system.

Figure 7:
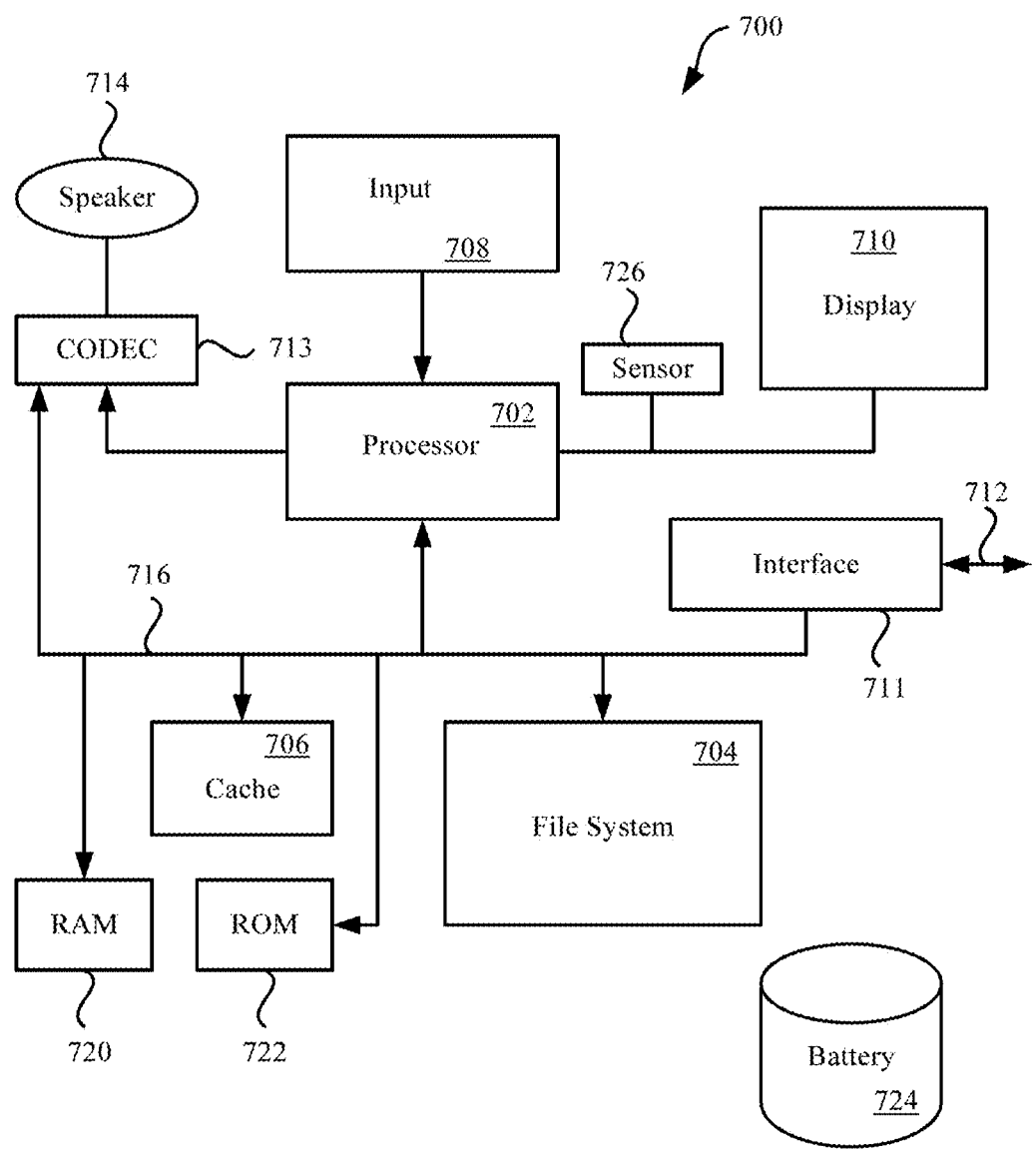
FIG. 7 shows an electronic device suitable for use in a computer aided manufacturing process.

FIG. 7 is a block diagram of electronic device 700 suitable for use during a computer aided manufacturing process. Electronic device 700 illustrates circuitry of a representative computing device. Electronic device 700 includes a processor 702 that pertains to a microprocessor or controller for controlling the overall operation of electronic device 700. Electronic device 700 contains instruction data pertaining to manufacturing instructions in a file system 704 and a cache 706. The file system 704 is, typically, a storage disk or a plurality of disks. The file system 704 typically provides high capacity storage capability for the electronic device 700. However, since the access time to the file system 704 is relatively slow, the electronic device 700 can also include a cache 706. The cache 706 is, for example, Random-Access Memory (RAM) provided by semiconductor memory. The relative access time to the cache 706 is substantially shorter than for the file system 704. However, the cache 706 does not have the large storage capacity of the file system 704. Further, the file system 704, when active, consumes more power than does the cache 706. The power consumption is often a concern when the electronic device 700 is a portable device that is powered by a battery 724. The electronic device 700 can also include a RAM 720 and a Read-Only Memory (ROM) 722. The ROM 722 can store programs, utilities or processes to be executed in a non-volatile manner. The RAM 720 provides volatile data storage, such as for cache 706.

The electronic device 700 also includes a user input device 708 that allows a user of the electronic device 700 to interact with the electronic device 700. For example, the user input device 708 can take a variety of forms, such as a button, keypad, dial, touch screen, audio input interface, visual/image capture input interface, input in the form of sensor data, etc. Still further, the electronic device 700 includes a display 710 (screen display) that can be controlled by the processor 702 to display information to the user. A data bus 716 can facilitate data transfer between at least the file system 704, the cache 706, the processor 702, and a CODEC 713. The CODEC 713 can be used to decode and play a plurality of media items from file system 704 that can correspond to certain activities taking place during a particular manufacturing process. The processor 702, upon a certain manufacturing event occurring, supplies the media data (e.g., audio file) for the particular media item to a coder/decoder (CODEC) 713. The CODEC 713 then produces analog output signals for a speaker 714. The speaker 714 can be a speaker internal to the electronic device 700 or external to the electronic device 700. For example, headphones or earphones that connect to the electronic device 700 would be considered an external speaker.

The electronic device 700 also includes a network/bus interface 711 that couples to a data link 712. The data link 712 allows the electronic device 700 to couple to a host computer or to accessory devices. The data link 712 can be provided over a wired connection or a wireless connection. In the case of a wireless connection, the network/bus interface 711 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 726 can take the form of circuitry for detecting any number of stimuli. For example, sensor 726 can include any number of sensors for monitoring a manufacturing operation such as for example a Hall Effect sensor responsive to external magnetic field, an audio sensor, a light sensor such as a photometer, a depth measurement device such as a laser interferometer and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line used to fabricate computer components such as computer housing formed of metal or plastic. The computer readable medium is any data storage device that can store data which can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An electronic device, comprising:
   a device housing;
   a display panel; and
   an integrated support member substantially parallel to the display panel, the integrated support member comprising:
   a glass reinforced epoxy laminate substrate,
   a plurality of electrical components surface mounted to a first surface of the glass reinforced epoxy laminate substrate,
   a plurality of metallic fingers configured to dissipate heat across the first surface of the glass reinforced epoxy laminate substrate and away from the plurality of electrical components, and
   an electrically conductive trace configured to transmit electrical signals across the first surface of the glass reinforced epoxy laminate substrate,
   wherein the plurality of metallic fingers and the electrically conductive trace are coplanar.

2. The electronic device as recited in claim 1, wherein the plurality of metallic fingers are formed from copper, and the electrically conductive trace is also formed from copper.

3. The electronic device as recited in claim 2, wherein the plurality of surface mounted electrical components comprises a plurality of light emitting diodes (LEDs).

4. The electronic device as recited in claim 3, wherein the plurality of copper comprises a grid pattern, the grid pattern occupying more surface area across surface portions of the glass reinforced epoxy laminate substrate that are subject to relatively higher levels of heat loading.

5. The electronic device as recited in claim 3, further comprising:
   a first electrical component mounted to a second surface of the glass reinforced epoxy laminate substrate; and
   a flexible circuit electrically coupling the first electrical component to a second electrical component arranged on another printed circuit board disposed on a bottom inner surface of the device housing.

6. The electronic device as recited in claim 1, wherein the electrically conductive trace electrically couples at least one of the plurality of electrical components to an external ground by a plurality of grounding fingers when an external cable is in electrical communication with the electronic device.

7. A laminated support member configured to support a display panel, the laminated support member comprising:
- a grid of metallic material arranged in a pattern configured to normalize a distribution of heat across the laminated support layer; and
- a plurality of electrical traces,
- wherein the grid of metallic material and the plurality of electrical traces are coplanar.

8. The laminated support member as recited in claim 7, wherein the grid of metallic material covers portions of the laminated support member that are subject to relatively higher levels of heat loading than other portions of the laminated support member.

9. The laminated support member as recited in claim 7, wherein the laminated support member is configured to dissipate a point load created by an interior device component.

10. The laminated support member as recited in claim 7, wherein the plurality of electrical traces are configured to electrically couple electrical components disposed on the laminated support member.

11. The laminated support member as recited in claim 10, further comprising:
- a plurality of light emitting diodes (LEDs) surface mounted proximate to a first edge of the laminated support member,
- wherein the plurality of electrical traces electrically couple the plurality of LEDs.

12. The laminated support member as recited in claim 11, wherein the laminated support member is mechanically coupled to the display panel.

13. The laminated support member as recited in claim 12, wherein the grid of metallic material and the plurality of electrical traces are formed on the laminated support member by etching away portions of a single layer of copper.

14. A laminated support member configured to support a display assembly, the laminated support member comprising:
- a metallic finger disposed on a first surface of the laminated support member and configured to normalize a distribution of heat across the laminated support layer; and
- an electrical trace disposed on the first surface of the laminated support member and configured to transmit communications across the first surface of the laminated support member.

15. The laminated support member as recited in claim 14, further comprising:
- a plurality of electrical components coupled to the first surface of the laminated support member.

16. The laminated support member as recited in claim 15, wherein the metallic finger and electrical trace are formed on the first surface of the laminated support member by etching away portions of a single layer of copper.

17. The laminated support member as recited in claim 16, wherein the plurality of electrical components comprises a plurality of light emitting diodes (LEDs).

18. The laminated support member as recited in claim 15, wherein the metallic finger comprises a tapered copper grid pattern.

19. The laminated support member as recited in claim 15, wherein the metallic finger has a substantially triangular geometry, and wherein a first side of the metallic finger is positioned proximate the plurality of electrical components.

20. The laminated support member as recited in claim 15, further comprising:
- a metallic ellipse disposed on the first surface of the laminated support member and in thermally conductive contact with the metallic finger.

* * * * *

UNITED STATES PATENT AND TRADEMARK OFFICE
CERTIFICATE OF CORRECTION

PATENT NO. : 8,976,527 B2  
APPLICATION NO. : 13/631973  
DATED : March 10, 2015  
INVENTOR(S) : Kevin D. Gibbs et al.

Page 1 of 1

It is certified that error appears in the above-identified patent and that said Letters Patent is hereby corrected as shown below:

In the Claims

Column 8, line 53 (Claim 4): "copper comprises" should read -- copper fingers comprises --.

Column 9, line 7 (Claim 7): "support layer;" should read -- support member; --.

Column 10, line 7 (Claim 14): "support layer;" should read -- support member; --.

Signed and Sealed this  
Second Day of June, 2015

Michelle K. Lee  
*Director of the United States Patent and Trademark Office*